US 11,901,887 B2

(12) United States Patent
Wakazono et al.

(10) Patent No.: US 11,901,887 B2
(45) Date of Patent: Feb. 13, 2024

(54) SWITCH DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Keisuke Wakazono, Yokkaichi (JP); Yuuki Sugisawa, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 5 days.

(21) Appl. No.: 17/753,012

(22) PCT Filed: Aug. 14, 2020

(86) PCT No.: PCT/JP2020/030834
§ 371 (c)(1),
(2) Date: Feb. 15, 2022

(87) PCT Pub. No.: WO2021/033630
PCT Pub. Date: Feb. 25, 2021

(65) Prior Publication Data
US 2022/0329241 A1 Oct. 13, 2022

(30) Foreign Application Priority Data
Aug. 22, 2019 (JP) .................................. 2019-151934

(51) Int. Cl.
*H03K 17/06* (2006.01)
*H03K 17/081* (2006.01)
(Continued)

(52) U.S. Cl.
CPC ............. *H03K 17/687* (2013.01); *H02H 3/38* (2013.01); *H03K 17/063* (2013.01); *H03K 17/08104* (2013.01)

(58) Field of Classification Search
None
See application file for complete search history.

(56) References Cited

U.S. PATENT DOCUMENTS 5,028,811 A * 7/1991 Le Roux .......... H03K 17/04123
327/482
5,187,632 A * 2/1993 Blessing ................ H03K 17/12
257/341
(Continued)

FOREIGN PATENT DOCUMENTS

JP 2002-076865 A 3/2002

OTHER PUBLICATIONS

International Search Report, Application No. PCT/JP2020/030834, dated Sep. 15, 2020. ISA/Japan Patent Office.

*Primary Examiner* — Kenneth B Wells
(74) *Attorney, Agent, or Firm* — Honigman LLP

(57) ABSTRACT

In a semiconductor switch, a resistance value between a current input terminal to which a current is input and a current output terminal from which a current is output decreases as a voltage of a control terminal based on a potential of the current output terminal increases. A booster circuit is disposed on a path extending from the current input terminal to the control terminal. The booster circuit boosts a voltage input from the current input terminal side and applies the boosted voltage to the control terminal. A switch is connected between the control terminal and the current output terminal of the semiconductor switch. The switch is (Continued)

switched off by power consumption. The power consumption stops and the switch switches on if the supply of power to the booster circuit stops.

3 Claims, 8 Drawing Sheets

(51) Int. Cl.
*H03K 17/687* (2006.01)
*H02H 3/38* (2006.01)

(56) References Cited

U.S. PATENT DOCUMENTS

| | | | | |
|---|---|---|---|---|
| 5,592,117 | A * | 1/1997 | Nadd | H03K 17/0822 |
| | | | | 327/365 |
| 7,248,078 | B2 * | 7/2007 | Mitsuda | H03K 17/0822 |
| | | | | 326/27 |
| 7,508,255 | B2 * | 3/2009 | Furuichi | G11C 5/143 |
| | | | | 327/543 |
| 7,606,015 | B2 * | 10/2009 | Tanabe | H03K 17/0822 |
| | | | | 361/91.1 |
| 9,112,494 | B2 * | 8/2015 | Kartal | H03K 17/063 |
| 9,912,329 | B2 * | 3/2018 | Fukami | H03K 17/731 |
| 11,522,535 | B2 * | 12/2022 | Otsu | H03K 17/687 |
| 2003/0021073 | A1 | 1/2003 | Nagata | |
| 2006/0038584 | A1 | 2/2006 | Mitsuda | |
| 2008/0170345 | A1 | 7/2008 | Tanabe | |
| 2009/0002055 | A1 | 1/2009 | Kojima | |
| 2014/0368255 | A1 | 12/2014 | Hayasaka | |
| 2019/0308573 | A1 | 10/2019 | Itou et al. | |

* cited by examiner

Operation of first switching circuit

SWITCH DEVICE

CROSS-REFERENCE TO RELATED APPLICATIONS

This application is the U.S. national stage of PCT/JP2020/030834 filed on Aug. 14, 2020, which claims priority of Japanese Patent Application No. JP 2019-151934 filed on Aug. 22, 2019, the contents of which are incorporated herein.

TECHNICAL FIELD

The present disclosure relates to a switch device.

BACKGROUND

JP 2009-10477A discloses a vehicle switch device that controls the supply of power from a battery to a load. In this switch device, a current flows from the battery to the load via a semiconductor switch. The semiconductor switch is an N-channel field-effect transistor (FET). The drain and the source of the semiconductor switch are respectively disposed on the battery side and the load side. An internal circuit switches the semiconductor switch on by raising the gate voltage of the semiconductor switch, and switches the semiconductor switch off by decreasing the gate voltage of the semiconductor switch.

In the switch device disclosed in JP 2009-10477A, a switch is disposed between the gate and the source of the semiconductor switch. The switch is also an N-channel FET. The drain and the source of the switch are respectively disposed on the gate side and the source side of the semiconductor switch. A first resistor is connected between the gate and the source of the switch.

In the switch device disclosed in JP 2009-10477A, a current flows from the positive electrode of the battery, through the internal circuit and a second resistor in this order, and back to the negative electrode of the battery. Thus, power is supplied to the internal circuit. While power is being supplied to the internal circuit in such a manner, a current flows to the second resistor rather than the first resistor. In this case, the gate voltage based on the source potential is 0 V in the switch, and the switch is off.

If a disconnection occurs in a connection line connecting the second resistor and the negative electrode of the battery, i.e., if an abnormality occurs in the supply of power to the internal circuit, a current flows through the internal circuit and the first resistor in this order. In this case, a voltage drop occurs in the first resistor, and thus a voltage is applied between the source and the gate of the switch. Here, the gate voltage based on the source potential is higher than or equal to a threshold in the switch, and the switch switches on. If the switch switches on, the gate voltage based on the source potential decreases to 0 V in the semiconductor switch, and the semiconductor switch is forced to switch off.

While the operation of the internal circuit may become unstable if a disconnection occurs in the connection line connecting the second resistor and the negative electrode of the battery, the semiconductor switch is forced to switch off in such a case. Therefore, no current flows via the semiconductor switch, and thus the semiconductor switch is prevented from entering an abnormal state.

In the switch device disclosed in JP 2009-10477A, the voltage between both terminals of the first resistor, i.e., the voltage between the gate and the source of the switch, is dependent on the voltage between both terminals of the battery, the resistance value of the internal circuit, etc. Furthermore, these values may change. Accordingly, even if a disconnection occurs in the connection line connecting the second resistor and the negative electrode of the battery, the voltage between the gate and the source of the switch may not become higher than or equal to the threshold. In such a case, the switch does not switch on, and the semiconductor switch does not switch off.

In view of this, the present disclosure aims to provide a switch device in which a semiconductor switch reliably switches off if an abnormality concerning power supply occurs.

SUMMARY

A switch device according to one aspect of the present disclosure includes: a semiconductor switch in which a resistance value between a current input terminal to which a current is input and a current output terminal from which a current is output decreases as a voltage of a control terminal based on a potential of the current output terminal increases; a booster circuit that is disposed on a path extending from the current input terminal to the control terminal, and that boosts a voltage input from the current input terminal side and applies the boosted voltage to the control terminal; and a switch that is switched off by power consumption and that switches on if the power consumption stops, wherein the switch is connected between the control terminal and the current output terminal, and the power consumption concerning the switch stops if the supply of power to the booster circuit stops.

Advantageous Effects

According to the present disclosure, a semiconductor switch reliably switches off if an abnormality concerning power supply occurs.

DETAILED DESCRIPTION OF PREFERRED EMBODIMENTS

Figure 1:
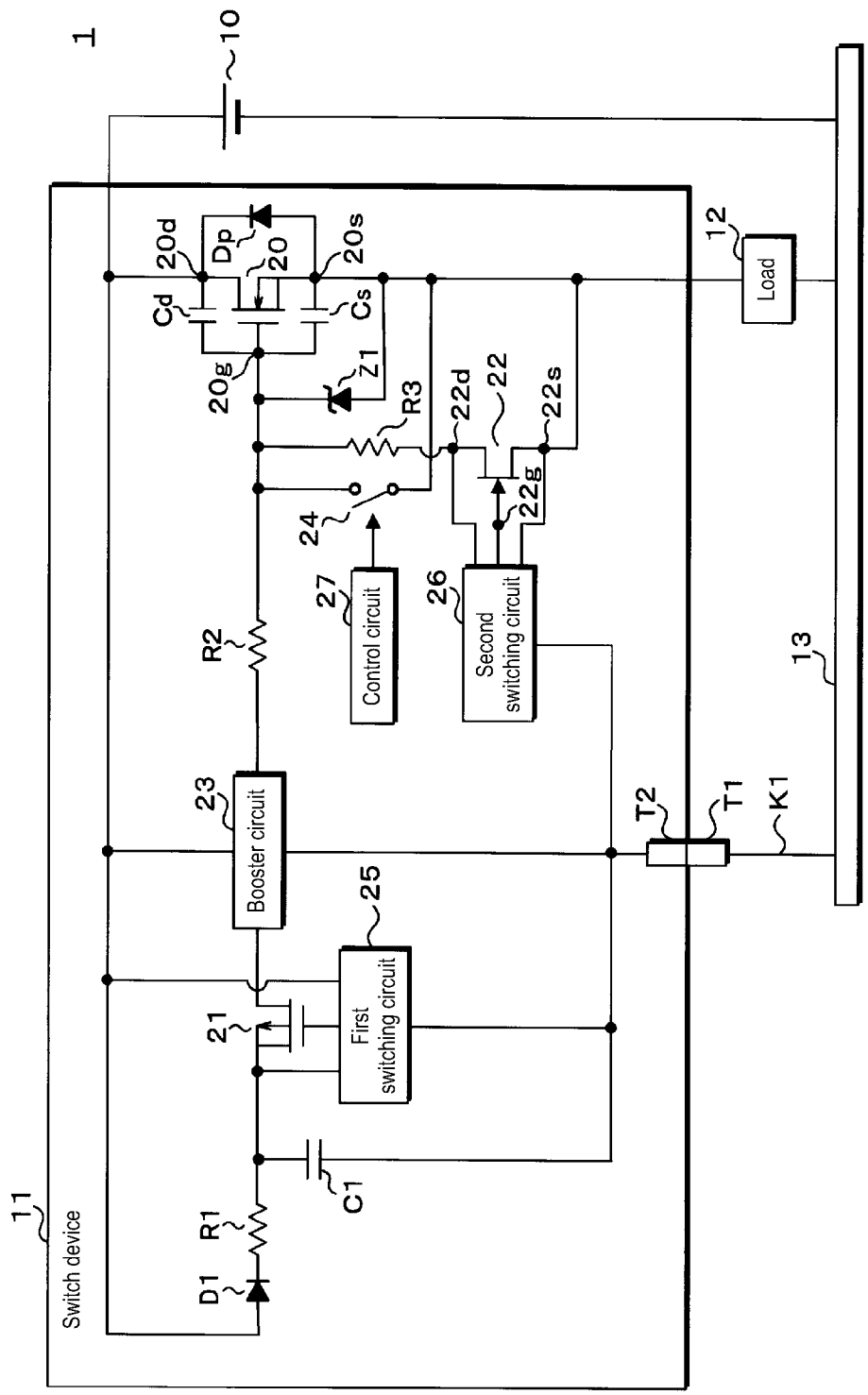
FIG. 1 is a circuit diagram of a power supply system in embodiment 1.

First, aspects of the present disclosure will be listed and described. The embodiments described below may at least be partially combined as appropriate.

A switch device according to one aspect of the present disclosure includes: a semiconductor switch in which a resistance value between a current input terminal to which a current is input and a current output terminal from which a current is output decreases as a voltage of a control terminal based on a potential of the current output terminal increases; a booster circuit that is disposed on a path extending from the current input terminal to the control terminal, and that boosts a voltage input from the current input terminal side and applies the boosted voltage to the control terminal; and a switch that is switched off by power consumption and that switches on if the power consumption stops, wherein the switch is connected between the control terminal and the current output terminal, and the power consumption concerning the switch stops if the supply of power to the booster circuit stops.

In the above-described aspect, the booster circuit boosts the voltage of the current input terminal of the semiconductor switch and applies the boosted voltage to the control terminal of the semiconductor switch. Thus, the semiconductor switch switches on. If an abnormality concerning the supply of power to the booster circuit occurs, i.e., if the supply of power to the booster circuit stops, the switch switches on. Thus, the voltage of the control terminal based on the potential of the current output terminal decreases to 0 V in the semiconductor switch, and the semiconductor switch switches off.

Because the switch switches on when power consumption is stopped, the switch is switched on independently of the voltage of the current input terminal of the semiconductor switch, the resistance value of the booster circuit, etc. Consequently, if an abnormality concerning the supply of power to the booster circuit occurs, the switch reliably switches on, and the semiconductor switch reliably switches off.

The switch device according to one aspect of the present disclosure further includes a second switch that is connected between the current input terminal and the booster circuit and that switches off if the supply of power to the booster circuit stops.

In the above-described aspect, if an abnormality occurs in the supply of power to the booster circuit, i.e., if the supply of power to the booster circuit stops, the second switch switches off and thus no current flows from the booster circuit to the control terminal side of the semiconductor switch. Consequently, the amount of power consumed is suppressed.

In the switch device according to one aspect of the present disclosure, in regard to the switch, a resistance value between a control terminal-side first terminal and a current output terminal-side second terminal increases as a voltage of a second control terminal based on a potential of the second terminal decreases, the switch device further includes a resistor that is connected between the second terminal and the second control terminal, a current flows from the second terminal side to the second control terminal side via the resistor while the semiconductor switch is on, and the current flow via the resistor stops if the supply of power to the booster circuit stops.

In the above-described aspect, a current flows from the second terminal of the switch to the second control terminal of the switch via the resistor while power is being supplied to the booster circuit. In this case, the voltage of the second control terminal based on the potential of the second terminal in the switch is a negative voltage and low. The resistance value between the first terminal and the second terminal in the switch is large, and the switch is off. If the supply of power to the booster circuit stops, the current flow via the resistor stops, and thus, the voltage of the second control terminal based on the potential of the second terminal increases to 0 V in the switch, and the switch switches on.

The switch device according to one aspect of the present disclosure further includes a Zener diode which is connected between the first terminal and the second control terminal of the switch, a cathode and an anode of the Zener diode being respectively disposed on the first terminal side and the second control terminal side, wherein the booster circuit boosts the voltage input from the current input terminal side to a target voltage, and a breakdown voltage of the Zener diode is higher than the target voltage.

In the above-described aspect, because the breakdown voltage of the Zener diode is higher than the target voltage, no current flows via the Zener diode while the booster circuit is performing voltage boosting. Consequently, the amount of power consumed is suppressed.

Specific examples of a power supply system according to embodiments of the present disclosure will be described in the following with reference to the drawings. Note that the present invention is not limited to these examples, and is intended to include all modifications that are indicated by the claims and are within the meaning and scope of equivalents of the claims.

Embodiment 1

Configuration of Power Supply System

FIG. 1 is a circuit diagram of a power supply system 1 in embodiment 1. The power supply system 1 is suitably installed in a vehicle, and includes a battery 10, a switch device 11, a load 12, a GND conductor 13, and a connection terminal T1. The switch device 11 includes a semiconductor switch 20 and a connection terminal T2. The semiconductor switch 20 is an N-channel FET.

The positive electrode of the battery 10 is connected to a drain 20*d* of the semiconductor switch 20. A source 20*s* of the semiconductor switch 20 is connected to one terminal of the load 12. The negative electrode of the battery 10 and the other terminal of the load 12 are connected to the GND conductor 13. The connection terminal T1 is connected to the GND conductor 13 via a connection line K1. For example, the GND conductor 13 is the body of the vehicle. The connection to the GND conductor 13 is equivalent to grounding. The connection terminal T1 is detachably connected to the connection terminal T2 of the switch device 11.

The battery 10 supplies power to the load 12 via the semiconductor switch 20 of the switch device 11. Here, a current flows from the positive electrode of the battery 10, through the semiconductor switch 20, the load 12, and the GND conductor 13 in this order, and back to the negative electrode of the battery 10. In the semiconductor switch 20, the current is input to the drain 20*d* and is output from the source 20*s* to the load 12. The drain 20*d* and the source 20*s* of the semiconductor switch 20 respectively function as a current input terminal and a current output terminal.

The load 12 is an electric device that is installed in the vehicle. The load 12 operates while power is supplied thereto. The load 12 stops operating if the supply of power thereto stops.

If the connection terminal T1 is connected to the connection terminal T2 of the switch device 11, a current flows from the positive electrode of the battery 10, through the switch device 11, the connection terminal T1, and the GND conductor 13 in this order, and back to the negative electrode of the battery 10. Thus, power is supplied to the switch device 11.

If power is supplied thereto, the switch device 11 controls the supply of power from the battery 10 to the load 12 by switching the semiconductor switch 20 on or off. If the switch device 11 switches the semiconductor switch 20 on, power is supplied to the load 12, and the load 12 operates. If the switch device 11 switches the semiconductor switch 20 off, the supply of power to the load 12 stops, and the load 12 stops operating.

If the connection terminals T1 and T2 are disconnected from one another or a disconnection occurs in the connection line K1, the supply of power from the battery 10 to the switch device 11 stops. If the supply of power from the battery 10 to the switch device 11 stops in such a manner, the switch device 11 switches the semiconductor switch 20 off. Thus, the supply of power from the battery 10 to the load 12 stops.

Configuration of Switch Device 11

In addition to the semiconductor switch 20 and the connection terminal T2, the switch device 11 includes a first switch 21, a second switch 22, a booster circuit 23, a control switch 24, a first switching circuit 25, a second switching circuit 26, a control circuit 27, capacitors C1, Cd, and Cs, diodes D1 and Dp, resistors R1, R2, and R3, and a Zener diode Z1.

The first switch 21 is a P-channel FET. The second switch 22 is an N-channel FET. The second switch 22 is a junction FET. The capacitor Cd is connected between the drain $20d$ and a gate $20g$ of the semiconductor switch 20. The capacitor Cs is connected between the source $20s$ and the gate $20g$ of the semiconductor switch 20. The capacitors Cd and Cs are parasitic capacitances that are formed in the manufacturing process of the semiconductor switch 20. The cathode and the anode of the diode Dp are respectively connected to the drain $20d$ and the source $20s$ of the semiconductor switch 20. The diode Dp is a parasitic diode formed in the manufacturing process of the semiconductor switch 20.

The drain $20d$ of the semiconductor switch 20 is connected to the booster circuit 23, the first switching circuit 25, and the anode of the diode D1. The cathode of the diode D1 is connected to one terminal of the resistor R1. The other terminal of the resistor R1 is connected to the source of the first switch 21 and one terminal of the capacitor C1. The other terminal of the capacitor C1 is connected to the connection terminal T2. The source and the gate of the first switch 21 are connected to the first switching circuit 25. The first switching circuit 25 is also connected to the connection terminal T2. The drain of the first switch 21 is connected to the booster circuit 23.

Accordingly, the first switch 21 is connected between the drain $20d$ of the semiconductor switch 20 and the booster circuit 23. The first switch 21 functions as a second switch.

The booster circuit 23 is also connected to one terminal of the resistor R2 and the connection terminal T2. The other terminal of the resistor R2 is connected to the gate $20g$ of the semiconductor switch 20. The gate $20g$ of the semiconductor switch 20 is also connected to one terminal of the control switch 24, one terminal of the resistor R3, and the cathode of the Zener diode Z1.

The other terminal of the control switch 24 and the anode of the Zener diode Z1 are connected to the source $20s$ of the semiconductor switch 20. The other terminal of the resistor R3 is connected to a drain $22d$ of the second switch 22. A source $22s$ of the second switch 22 is connected to the source $20s$ of the semiconductor switch 20. The drain $22d$, a gate $22g$, and the source $22s$ of the second switch 22 are each separately connected to the second switching circuit 26. The second switching circuit 26 is also connected to the connection terminal T2.

Accordingly, the second switch 22 is connected between the gate $20g$ and the source $20s$ of the semiconductor switch 20.

The battery 10 charges the capacitor C1 via the diode D1 and the resistor R1. Here, a current flows from the positive electrode of the battery 10, through the diode D1, the resistor R1, the capacitor C1, the connection terminals T2 and T1, and the GND conductor 13 in this order, and back to the negative electrode of the battery 10. Power is stored in the capacitor C1.

If the gate voltage based on the source potential is lower than a first threshold in the first switch 21, the first switch 21 is on, and a current can flow therethrough via the drain and the source of the first switch 21. If the gate voltage based on the source potential is higher than or equal to the first threshold in the first switch 21, the first switch 21 is off, and no current flows therethrough via the drain and the source of the first switch 21. The first threshold is a fixed value and is set in advance.

The mode of the first switch 21 is an enhancement mode. Thus, the first threshold is a negative value. If the gate voltage based on the source potential is 0 V in the first switch 21, the first switch 21 is off.

The first switching circuit 25 keeps the first switch 21 on under normal conditions. If the connection terminals T1 and T2 are disconnected from one another or a disconnection occurs in the connection line K1, the first switching circuit 25 switches the first switch 21 off.

If the first switch 21 is on, the voltage between both terminals of the capacitor C1 is input to the booster circuit 23. In the following, the voltage between both terminals of the battery 10 is referred to as a "battery voltage". The capacitor C1 smooths the voltage of the drain $20d$ of the semiconductor switch 20 based on the potential of the GND conductor 13, i.e., the battery voltage, and outputs the smoothed voltage to the booster circuit 23 via the first switch 21. Accordingly, even if the battery voltage fluctuates, the voltage input to the booster circuit 23 is stable.

The battery 10 supplies power to the booster circuit 23. Here, a current flows from the positive electrode of the battery 10, through the booster circuit 23, the connection terminals T2 and T1, and the GND conductor 13 in this order, and back to the negative electrode of the battery 10. When power is being supplied to the booster circuit 23, the first switch 21 is on, and the booster circuit 23 boosts the voltage between both terminals of the capacitor C1 input from the drain $20d$ side of the semiconductor switch 20 to a target voltage. The target voltage is a fixed value and is set in advance. The target voltage is higher than the maximum value of the battery voltage.

If the connection terminals T1 and T2 are disconnected from one another or a disconnection occurs in the connection line K1, the supply of power from the battery 10 to the booster circuit 23 stops. If the supply of power to the booster circuit 23 stops, the booster circuit 23 stops operating and does not perform voltage boosting. As discussed above, if the connection terminals T1 and T2 are disconnected from one another or a disconnection occurs in the connection line K1, the first switch 21 switches off. Accordingly, if the supply of power to the booster circuit 23 stops, the first switch 21 switches off.

The booster circuit 23 applies the boosted voltage, i.e., the target voltage, to the gate $20g$ of the semiconductor switch 20 via the resistor R2. While the battery 10 is supplying power to the booster circuit 23, the booster circuit 23 continues to apply the target voltage to the gate 20g of the semiconductor switch 20. The target voltage is a voltage based on the potential of the GND conductor 13.

If the booster circuit 23 is performing voltage boosting, at least one of the capacitors Cd and Cs is charged when the control switch 24 is off. Here, a current flows from the positive electrode of the battery 10, i.e., the drain 20d of the semiconductor switch 20, and through the diode D1, the resistor R1, the first switch 21, the booster circuit 23, the resistor R2, and the gate 20g of the semiconductor switch 20 in this order. Accordingly, the first switch 21 and the booster circuit 23 are disposed on the path of a current that flows from the drain 20d of the semiconductor switch 20 to the gate 20g of the semiconductor switch 20.

If at least one of the capacitors Cd and Cs is charged, the voltage of the gate 20g based on the potential of the source 20s increases in the semiconductor switch 20. When the control switch 24 is on, a closed circuit is formed by the capacitor Cd, the control switch 24, and the diode Dp, and a closed circuit is formed by the capacitor Cs and the control switch 24. Thus, the capacitors Cd and Cs discharge via the control switch 24. If the power stored in the capacitor Cs equals 0 W, the voltage of the gate 20g based on the potential of the source 20s decreases to 0 V in the semiconductor switch 20.

If the booster circuit 23 is performing voltage boosting, the voltages of the gate 20g, the source 20s, and the drain 20d of the semiconductor switch 20 based on the potential of the GND conductor 13 are substantially the same when the control switch 24 is on. Thus, if the control switch 24 is on, the capacitors Cd and Cs are not charged by the target voltage output by the booster circuit 23. Here, the voltage drop caused by the diode Dp is ignored.

In regard to the semiconductor switch 20, the resistance value between the drain 20d and the source 20s decreases as the voltage of the gate 20g based on the potential of the source 20s increases. The gate 20g of the semiconductor switch 20 functions as a control terminal. When the control switch 24 switches from on to off in a case in which the booster circuit 23 is performing voltage boosting, the voltage of the gate 20g based on the potential of the source 20s increases to a sufficiently high voltage in the semiconductor switch 20, and the resistance value between the drain 20d and the source 20s of the semiconductor switch 20 decreases to a sufficiently small value. Consequently, the semiconductor switch 20 switches on.

If the control switch 24 switches from off to on, the voltage of the gate 20g based on the potential of the source 20s decreases to 0 Vin the semiconductor switch 20 as discussed above, and the resistance value between the drain 20d and the source 20s of the semiconductor switch 20 increases to a sufficiently large value. Consequently, the semiconductor switch 20 switches off. The mode of the semiconductor switch 20 is the enhancement mode. Accordingly, if the voltage of the gate 20g based on the potential of the source 20s is 0 V in the semiconductor switch 20, the resistance value between the drain 20d and the source 20s of the semiconductor switch 20 is sufficiently large, and the semiconductor switch 20 is off.

When the semiconductor switch 20 is off and the control switch 24 is on, the booster circuit 23 applies a voltage to the load 12 via the resistor R2. However, because the resistance value of the resistor R2 is sufficiently larger than the resistance value of the load 12, the voltage applied to the load 12 is sufficiently low. Consequently, the load 12 does not operate.

An operation signal for instructing the load 12 to operate and a stop signal for instructing the load 12 to stop operating are input to the control circuit 27. If the operation signal is input to the control circuit 27, the control circuit 27 switches the control switch 24 off and switches the semiconductor switch 20 on. Thus, power is supplied to the load 12, and the load 12 operates. If the stop signal is input to the control circuit 27, the control circuit 27 switches the control switch 24 on, and switches the semiconductor switch 20 off. Thus, the supply of power to the load 12 stops, and the load 12 stops operating.

The Zener diode Z1 limits the voltage between the gate 20g and the source 20s of the semiconductor switch 20 so as to be lower than or equal to a first breakdown voltage. The first breakdown voltage is a fixed value, and is higher than the target voltage. If the voltage of the gate 20g based on the potential of the source 20s reaches the first breakdown voltage in the semiconductor switch 20, a current flows through the cathode and the anode in this order in the Zener diode Z1. Thus, the voltage of the gate 20g based on the potential of the source 20s does not exceed the first breakdown voltage in the semiconductor switch 20. If the voltage of the gate 20g based on the potential of the source 20s is lower than the first breakdown voltage in the semiconductor switch 20, no current flows via the Zener diode Z1.

If the voltage of the gate 22g based on the potential of the source 22s is higher than or equal to a second threshold in the second switch 22, the second switch 22 is on, and a current can flow therethrough via the drain 22d and the source 22s of the second switch 22. If the voltage of the gate 22g based on the potential of the source 22s is lower than the second threshold in the second switch 22, the second switch 22 is off, and no current flows therethrough via the drain 22d and the source 22s of the second switch 22. The second threshold is a fixed value and is set in advance.

The mode of the second switch 22 is a depletion mode. Thus, the second threshold is a negative value. If the voltage of the gate 22g based on the potential of the source 22s is 0 V in the second switch 22, the second switch 22 is on.

If the semiconductor switch 20 switches on, the second switching circuit 26 switches the second switch 22 off. If the semiconductor switch 20 switches off, the second switching circuit 26 switches the second switch 22 on. Here, the booster circuit 23 applies a voltage to the load 12 via the resistors R2 and R3, and the second switch 22. However, because the combined resistance value of the resistors R2 and R3 is sufficiently larger than the resistance value of the load 12, the voltage applied to the load 12 is sufficiently low. Consequently, the load 12 does not operate.

If the connection terminals T1 and T2 are disconnected from one another or a disconnection occurs in the connection line K1, the second switching circuit 26 switches the second switch 22 on.

Suppose that the control switch 24 is off in a case in which the booster circuit 23 is performing voltage boosting. In this case, as discussed above, the capacitors Cd and Cs are charged, and the semiconductor switch 20 is on. If the connection terminals T1 and T2 are disconnected from one another or a disconnection occurs in the connection line K1 in this state, the second switching circuit 26 switches the second switch 22 on.

When the second switch 22 is on, a closed circuit is formed by the capacitor Cd, the resistor R3, the second switch 22, and the diode Dp, and a closed circuit is formed by the capacitor Cs, the resistor R3, and the second switch 22. Thus, the capacitors Cd and Cs discharge via the control switch 24. Accordingly, the voltage of the gate 20g based on the potential of the source 20s decreases to 0 V in the semiconductor switch 20, and the semiconductor switch 20 switches off.

Figure 2:
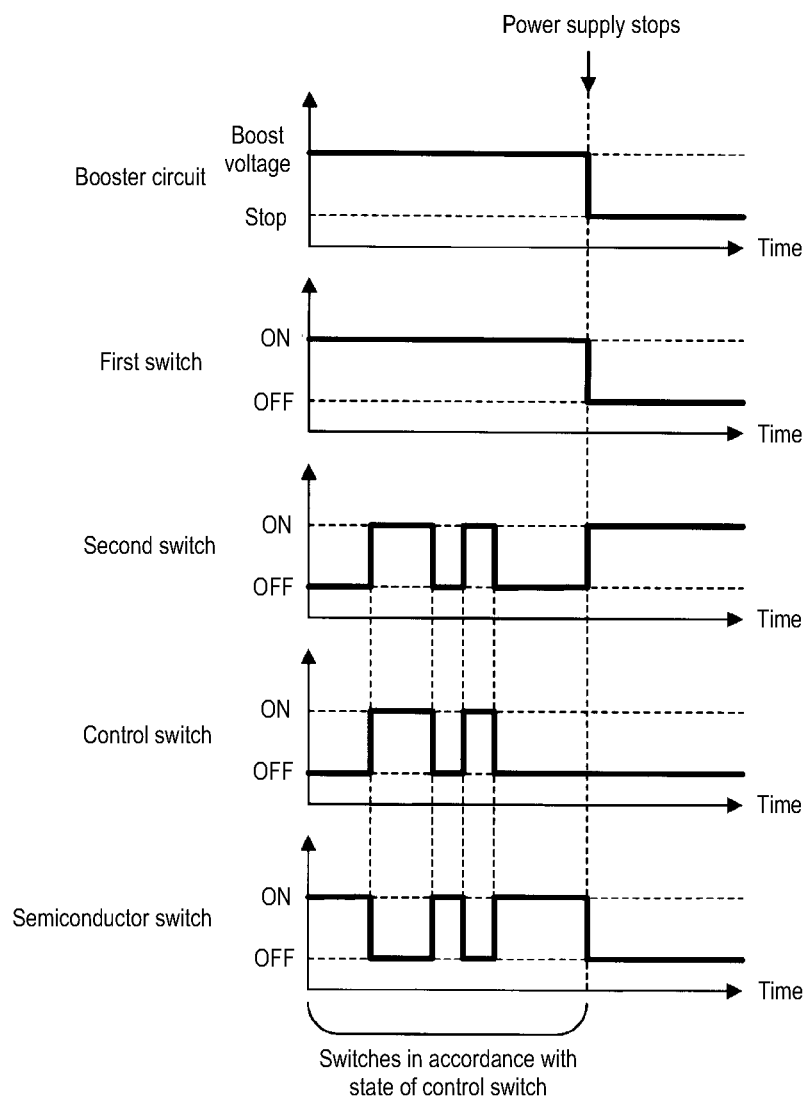
FIG. 2 is a timing chart for describing the operation of a switch device.

FIG. 2 is a timing chart for describing the operation of the switch device 11. In FIG. 2, the operation of the booster circuit 23, and the states of the first switch 21, the second switch 22, the control switch 24, and the semiconductor switch 20 are illustrated.

As discussed above, while power is being supplied to the booster circuit 23, the first switching circuit 25 keeps the first switch 21 on, and the booster circuit 23 continues to boost the voltage between both terminals of the capacitor C1 to the target voltage. If the control circuit 27 switches the control switch 24 off in this state, the semiconductor switch 20 switches on. If the control circuit 27 switches the control switch 24 on, the semiconductor switch 20 switches off.

If the semiconductor switch 20 switches off, the second switching circuit 26 switches the second switch 22 on. If the semiconductor switch 20 switches on, the second switching circuit 26 switches the second switch 22 off.

If the supply of power to the booster circuit 23 stops due to the connection terminals T1 and T2 being disconnected from one another or a disconnection occurring in the connection line K1, the booster circuit 23 stops performing voltage boosting. Furthermore, the first switching circuit 25 switches the first switch 21 off and the second switching circuit 26 switches the second switch 22 on, irrespective of the state of the control switch 24.

If the first switch 21 is off, no current flows via the booster circuit 23, which has stopped operating, and the resistor R2. Furthermore, when the second switch 22 is on, the capacitors Cd and Cs discharge, and the semiconductor switch 20 switches off as discussed above.

Thus, if the supply of power to the booster circuit 23 stops due to the connection terminals T1 and T2 being disconnected from one another or a disconnection occurring in the connection line K1, the semiconductor switch 20 switches off.

An example of a conventional configuration for switching the semiconductor switch 20 off in a case in which the connection terminals T1 and T2 are disconnected from one another or a disconnection occurs in the connection line K1 is a configuration in which the other terminal of the resistor R3 is directly connected to the source 20s of the semiconductor switch 20. In this case as well, the capacitors Cd and Cs would discharge via the resistor R3, and the semiconductor switch 20 would switch off when the connection terminals T1 and T2 are disconnected from one another or a disconnection occurs in the connection line K1. However, in this configuration, a current would continue to flow from the booster circuit 23 through the resistors R2 and R3 in this order while the booster circuit 23 is performing voltage boosting, and thus a large amount of power would be consumed.

As a result of disposing the second switch 22 in the switch device 11, no current flows from the booster circuit 23 to the load 12 unless the voltage between the gate 20g and the source 20s of the semiconductor switch 20 reaches a first breakdown voltage. Thus, a small amount of power is consumed.

In the following, the configurations of the first switching circuit 25 and the second switching circuit 26 will be described one by one.

Configuration of First Switching Circuit

Figure 3:
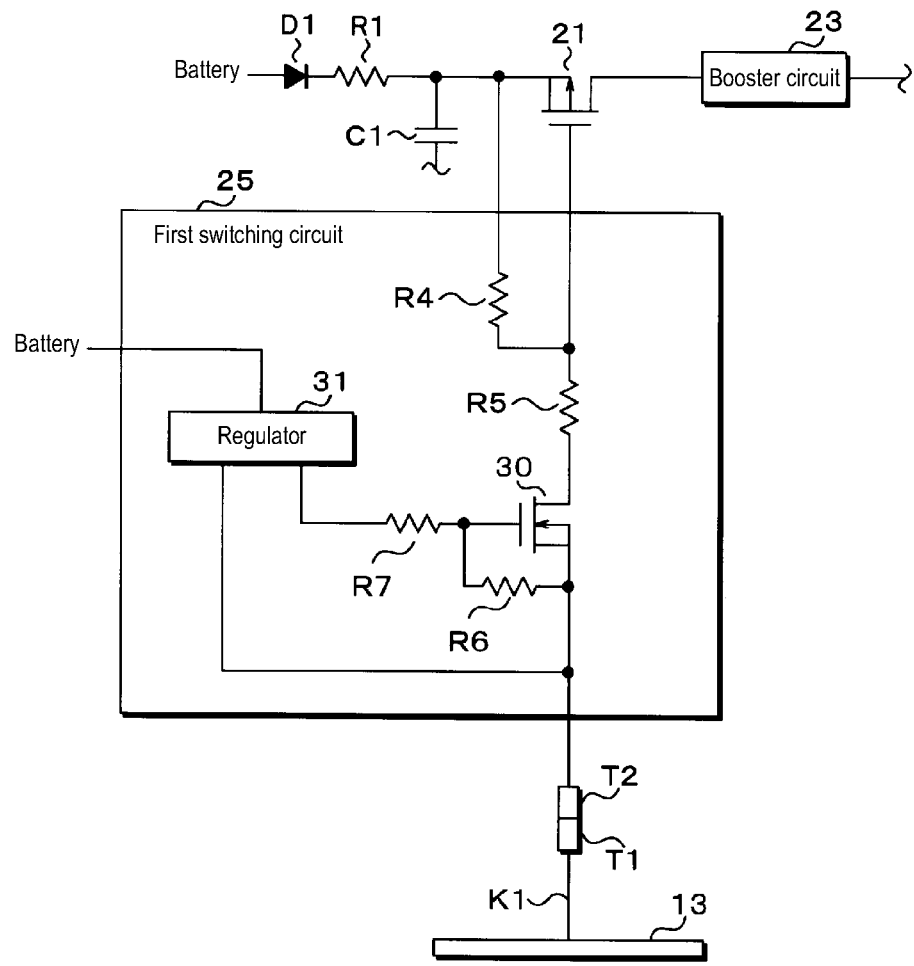
FIG. 3 is a circuit diagram of a first switching circuit.

FIG. 3 is a circuit diagram of the first switching circuit 25. The first switching circuit 25 includes a circuit switch 30, a regulator 31, and resistors RA, R5, R6, and R7. The circuit switch 30 is an N-channel FET. The resistor RA is connected between the source and the gate of the first switch 21. One terminal of the resistor R5 is connected to the gate of the first switch 21. The other terminal of the resistor R5 is connected to the drain of the circuit switch 30. The source of the circuit switch 30 is connected to the connection terminal T2.

The resistor R6 is connected between the gate and the source of the circuit switch 30. One terminal of the resistor R7 is also connected to the gate of the circuit switch 30. The other terminal of the resistor R7 is connected to the regulator 31. The regulator 31 is also connected to the drain 20d of the semiconductor switch 20, i.e., the positive electrode of the battery 10, and is connected to the connection terminal T2.

If the gate voltage based on the source potential is higher than or equal to a third threshold in the circuit switch 30, the circuit switch 30 is on. If the gate voltage based on the source potential is lower than the third threshold in the circuit switch 30, the circuit switch 30 is off. The third threshold is a fixed value and is set in advance. The mode of the circuit switch 30 is the enhancement mode. Thus, the third threshold is a positive value. If the gate voltage based on the source potential is 0 V, the circuit switch 30 is off.

The battery 10 supplies power to the regulator 31. Here, a current flows from the positive electrode of the battery 10, through the regulator 31, the connection terminals T2 and T1, and the GND conductor 13 in this order, and back to the negative electrode of the battery 10. If power is supplied to the regulator 31, the regulator 31 steps down the voltage of the drain 20d of the semiconductor switch 20 based on the potential of the GND conductor 13, i.e., the battery voltage, to a fixed set voltage that is set in advance, and outputs the stepped-down voltage to the resistor R7. Thus, a voltage is applied between the gate and the source of the circuit switch 30 because a current flows through the resistors R7 and R6 in this order, and a voltage drop occurs in the resistor R6.

Consequently, the gate voltage based on the source potential becomes higher than or equal to the third threshold in the circuit switch 30, and the circuit switch 30 switches on. The circuit switch 30 is kept on while power is being supplied to the regulator 31.

As discussed above, if the gate voltage based on the source potential is lower than the first threshold in the first switch 21, the first switch 21 is on. If the gate voltage based on the source potential is higher than or equal to the first threshold in the first switch 21, the first switch 21 is off. The first threshold is a negative value.

When the circuit switch 30 is on, a current flows from the positive electrode of the battery 10 and through the diode D1, and the resistors R1, R4, and R5 in this order, or flows from one terminal of the capacitor C1 and through the resistors R4 and R5 in this order. Thus, a voltage drop occurs in the resistor R4, and a voltage is applied between the gate and the source of the first switch 21. Consequently, the gate voltage based on the source potential is lower than the first threshold in the first switch 21, and the first switch 21 is off. In such a manner, if the circuit switch 30 is on, the first switch 21 is on.

If the supply of power to the booster circuit 23 stops due to the connection terminals T1 and T2 being disconnected from one another or a disconnection occurring in the connection line K1, the battery 10 stops supplying power to the regulator 31. In this case, the regulator 31 stops outputting a voltage to the resistor R7. If the regulator 31 stops outputting the voltage, no current flows through the resistors R7 and R6, and thus the voltage between the gate and the source of the circuit switch 30 decreases to 0 V, and the circuit switch 30 switches off. 0 V is lower than the third threshold.

If the circuit switch 30 switches off, the current flow via the resistors RA and R5 stops, and thus the gate voltage based on the source potential increases to 0 V in the first switch 21, and the first switch switches off. 0 V is higher than or equal to the first threshold.

Figure 4:
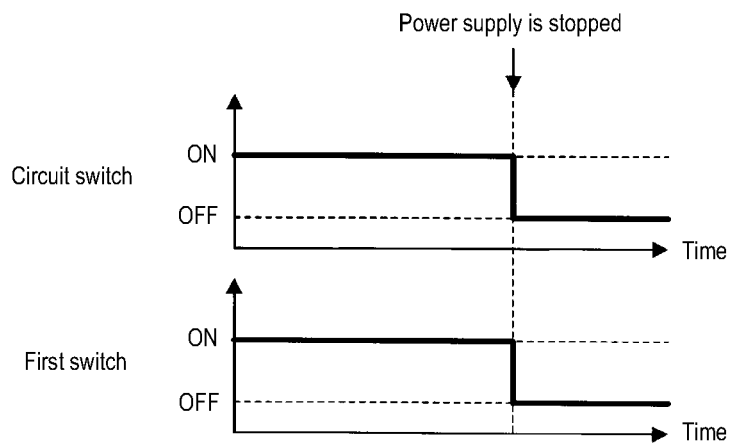
FIG. 4 is a timing chart for describing the operation of the first switching circuit.

FIG. 4 is a timing chart for describing the operation of the first switching circuit 25. The states of the circuit switch 30 and the first switch 21 are illustrated in FIG. 4. If power is supplied to the booster circuit 23, the battery 10 also supplies power to the regulator 31, and the regulator 31 outputs a voltage to the resistor R7. Thus, the circuit switch 30 is on. As discussed above, if the circuit switch 30 is on, the first switch 21 is on.

If the supply of power to the booster circuit 23 stops due to the connection terminals T1 and T2 being disconnected from one another or a disconnection occurring in the connection line K1 connecting the connection terminal T1 and the GND conductor 13, the supply of power to the regulator 31 also stops, and the regulator 31 stops outputting a voltage. Thus, the circuit switch 30 switches off. As discussed above, if the circuit switch 30 switches off, the first switch 21 switches off.

In such a manner, the first switching circuit 25 switches the first switch 21 from on to off if the supply of power to the booster circuit 23 stops.

Note that it suffices for the circuit switch 30 to be a switch that switches on if the voltage of a control terminal based on the potential of an output terminal from which a current is output becomes higher than or equal to the third threshold, and switches off if the voltage of the control terminal based on the potential of the output terminal falls below the third threshold. Thus, the circuit switch 30 is not limited to an N-channel FET, and may be an NPN bipolar transistor, for example. In this case, the drain, the source, and the gate of the FET respectively correspond to the collector, the emitter, and the base of the bipolar transistor.

Configuration of Second Switching Circuit

Figure 5:
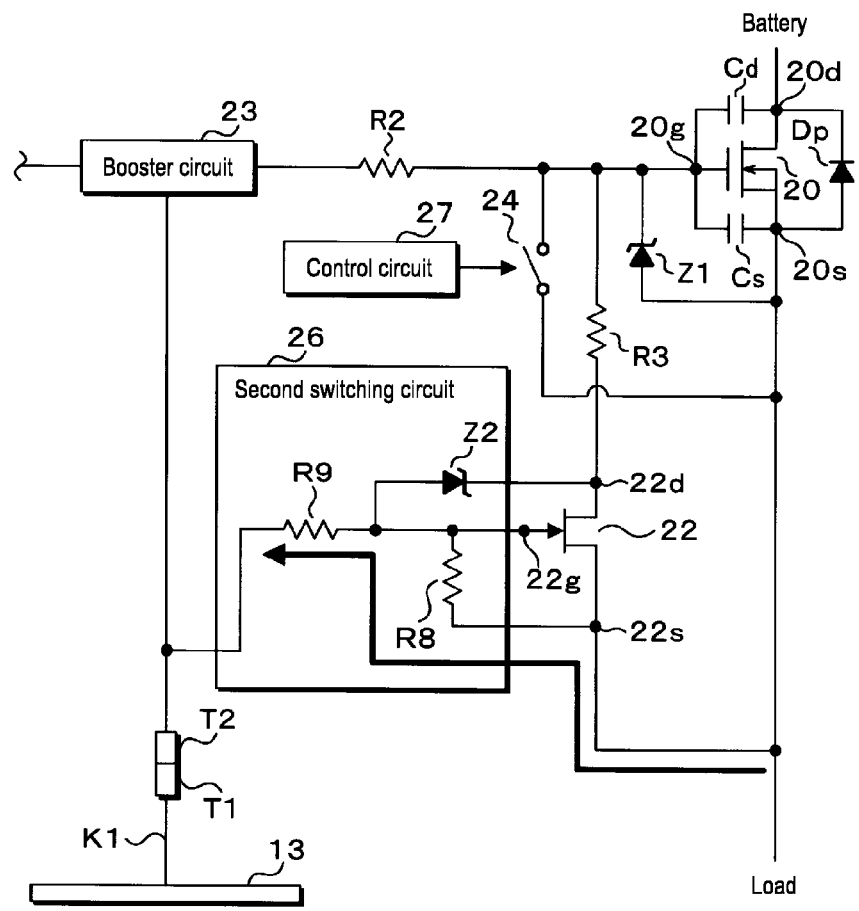
FIG. 5 is a circuit diagram of a second switching circuit.

FIG. 5 is a circuit diagram of the second switching circuit 26. The second switching circuit 26 includes resistors R8 and R9, and a Zener diode Z2. The resistor R8 is connected between the source 22s and the gate 22g of the second switch 22. The gate 22g of the second switch 22 is connected to one terminal of the resistor R9. The other terminal of the resistor R9 is connected to the connection terminal T2. The Zener diode Z2 is connected between the drain 22d and the gate 22g of the second switch 22. The cathode and the anode of the Zener diode Z2 are respectively disposed on the drain 22d-side and the gate 22g-side of the second switch 22.

As discussed above, if the voltage of the gate 22g based on the potential of the source 22s is higher than or equal to the second threshold in the second switch 22, the second switch 22 is on. If the voltage of the gate 22g based on the potential of the source 22s is lower than the second threshold in the second switch 22, the second switch 22 is off. The second threshold is a negative value.

Figure 6:
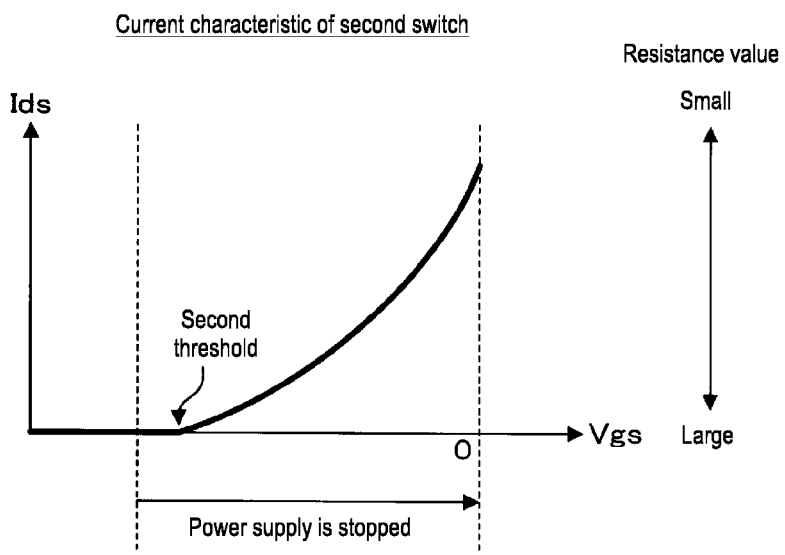
FIG. 6 is a graph illustrating a current characteristic of a second switch.

FIG. 6 is a graph illustrating a current characteristic of the second switch 22. Vgs indicates the voltage of the gate 22g based on the potential of the source 22s in the second switch 22. Ids indicates the current that can flow via the drain 22d and the source 22s in the second switch 22. The greater the current Ids is, the smaller the resistance value between the drain 22d and the source 22s of the second switch 22 is. As illustrated in FIG. 6, as the voltage Vgs decreases, the current Ids decreases, and the resistance value between the drain 22d and the source 22s of the second switch 22 increases. The drain 22d, the source 22s, and the gate 22g of the second switch 22 respectively function as a first terminal, a second terminal, and a second control terminal.

While the semiconductor switch 20 is on in a state in which the connection terminals T1 and T2 are connected to one another and the connection terminal T1 is connected to the GND conductor 13 via the connection line K1, a current flows from the positive electrode of the battery 10, through the semiconductor switch 20, the resistors R8 and R9, the connection terminals T2 and T1, and the GND conductor 13 in this order, and back to the negative electrode of the battery 10, as illustrated in FIG. 5. Thus, power is consumed by the resistor R8, a voltage drop occurs in the resistor R8, and a voltage is applied between the source 22s and the gate 22g of the second switch 22. Here, the voltage Vgs is lower than the second threshold, and thus the second switch 22 is off.

If the supply of power to the booster circuit 23 stops due to the connection terminals T1 and T2 being disconnected from one another or a disconnection occurring in the connection line K1, the current flow via the resistors R8 and R9 stops, and the consumption of power by the resistor R8 stops. If the power consumption stops, the voltage ceases to fall in the resistor R8, and thus the voltage Vgs increases to 0 V, and the second switch 22 switches on.

As discussed above, if the control circuit 27 switches the control switch 24 from off to on, the semiconductor switch 20 switches off. If the semiconductor switch 20 switches off, the current flow via the resistors R8 and R9 also stops, and thus the second switch 22 switches on. If the control circuit 27 switches the control switch 24 from on to off, the semiconductor switch 20 switches on, power is consumed by the resistor R8, and the second switch 22 switches off.

If the connection terminals T1 and T2 are disconnected from one another or a disconnection occurs in the connection line K1, an abnormality concerning the supply of power to the booster circuit 23 occurs, and the supply of power to the booster circuit 23 stops. Here, the second switch 22 switches on. Thus, the voltage of the gate 20g based on the potential of the source 20s decreases to 0 V in the semiconductor switch 20, and the semiconductor switch 20 switches off.

As discussed above, if a current flows through the resistors R8 and R9 and power is consumed, the second switch 22 switches off. If the current flow via the resistors R8 and R9 stops and the power consumption stops, the second switch 22 switches on. Thus, the second switch 22 switches on independently of the battery voltage, the resistance value of the booster circuit 23, etc. Consequently, if an abnormality concerning the supply of power to the booster circuit 23 occurs, the second switch 22 reliably switches on, and the semiconductor switch 20 reliably switches off.

Furthermore, if an abnormality in the supply of power to the booster circuit 23 occurs, no current flows from the drain 20d of the semiconductor switch 20 and via the booster circuit 23 and the second switch 22 because the first switch 21 switches off. Consequently, the amount of power consumed is suppressed.

The Zener diode Z2 limits the voltage between the drain 22d and the gate 22g of the second switch 22 so as to be lower than or equal to a second breakdown voltage. The second breakdown voltage is a fixed value, and is higher than the target voltage output by the booster circuit 23. If the voltage of the drain 22d based on the potential of the gate 22g reaches the second breakdown voltage in the second switch 22, a current flows through the cathode and the anode in this order in the Zener diode Z2. Thus, the voltage between the gate 22g and the drain 22d of the second switch 22 does not exceed the second breakdown voltage. If the voltage of the drain 22d based on the potential of the gate 22g is lower than the second breakdown voltage in the second switch 22, no current flows via the Zener diode Z2.

Because the second breakdown voltage is higher than the target voltage as discussed above, no current flows via the Zener diode Z2 while the booster circuit 23 is performing voltage boosting. Consequently, the amount of power consumed is further suppressed.

Note that it suffices for the first switch 21 to be a switch that switches on if the voltage of a control terminal based on the potential of one terminal on the resistor R1-side falls below the first threshold, and switches off if the voltage of the control terminal based on the potential of the one terminal on the resistor R1-side becomes higher than or equal to the first threshold. Thus, the first switch 21 is not limited to a P-channel FET, and may be a PNP bipolar transistor, for example.

Furthermore, it suffices for the second switch 22 to have two characteristics. The first characteristic is a characteristic that the resistance value thereof increases as the voltage of a control terminal based on the potential of one terminal on the source 20s side of the semiconductor switch 20 decreases. The second characteristic is a characteristic that the second switch 22 is on when the voltage of the control terminal based on the potential of the one terminal on the side of the source 20s of the semiconductor switch 20 is 0 V. Thus, the second switch 22 is not limited to a junction FET. Accordingly, if the second switch 22 is a depletion mode N-channel FET, the second switch 22 does not have to be a junction FET.

Embodiment 2

In embodiment 1, switches that are realized by semiconductors are used as the first switch 21 and the second switch 22. The switch for stopping the input of a current from the resistor R1 to the booster circuit 23 and the switch connected between the gate 20g and the source 20s of the semiconductor switch 20 are not limited to switches realized by semiconductors.

In the following, the differences of embodiment 2 from embodiment 1 will be described. Because configurations in embodiment 2 other than those described in the following are the same as those in embodiment 1, the same reference symbols as those given in embodiment 1 are given to components that are the same as those in embodiment 1, and description thereof will be omitted.

Configuration of Switch Device

Figure 7:
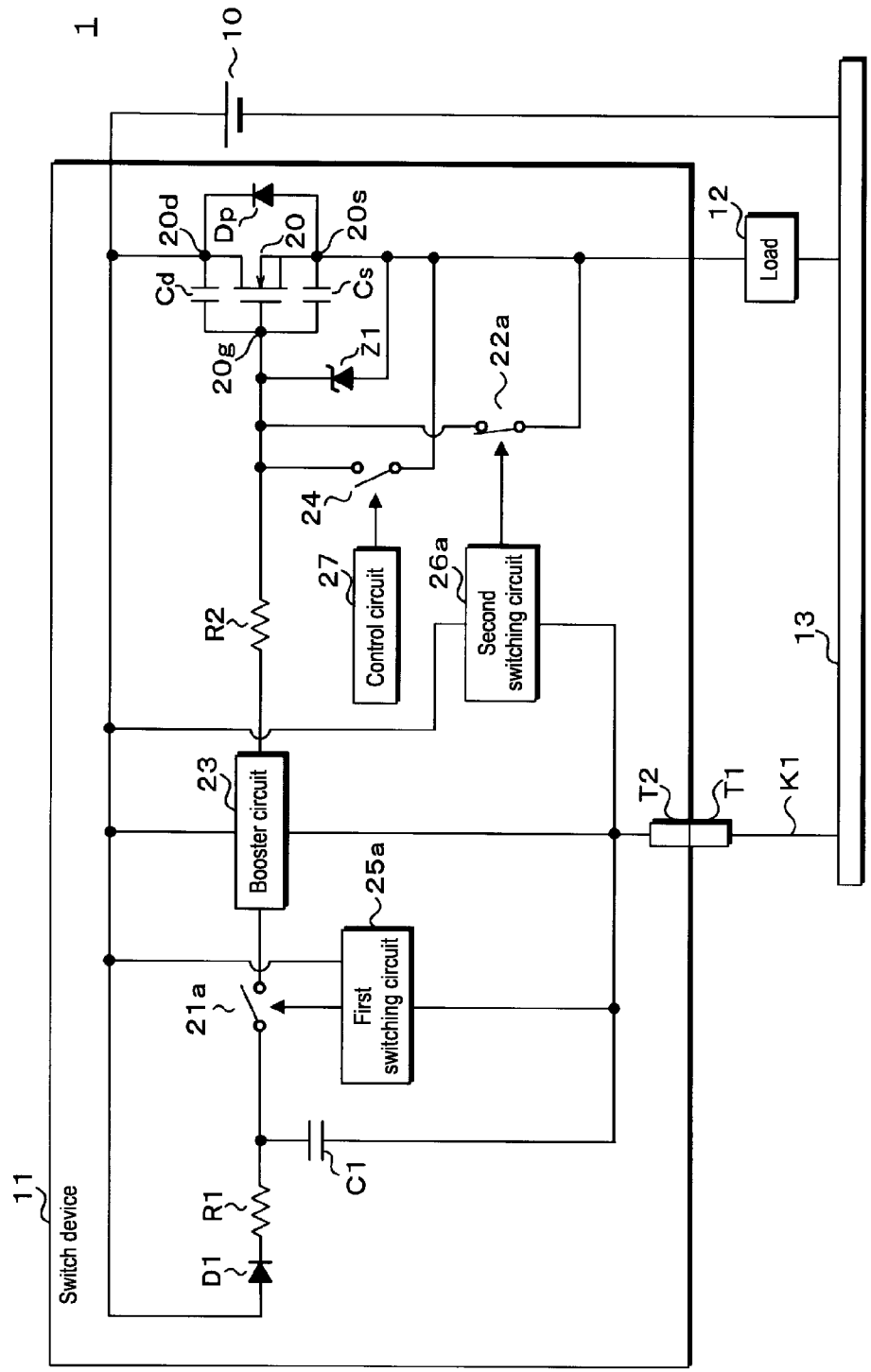
FIG. 7 is a circuit diagram of the power supply system in embodiment 2.

FIG. 7 is a circuit diagram of the power supply system 1 in embodiment 2. When embodiment 2 is compared with embodiment 1, the switch device 11 has a different configuration. The switch device 11 in embodiment 2 includes, among the components of the switch device 11 in embodiment 1, the components other than the first switch 21, the second switch 22, the first switching circuit 25, the second switching circuit 26, and the resistor R3, and such components are connected in a similar manner as in embodiment 1.

The switch device 11 in embodiment 2 includes a first switch 21a, a second switch 22a, a first switching circuit 25a, and a second switching circuit 26a in place of the first switch 21, the second switch 22, the first switching circuit 25, and the second switching circuit 26. The first switch 21a and the second switch 22a are relay contacts.

The first switch 21a is connected between the booster circuit 23 and a connection node between the resistor R1 and the capacitor C1. The second switch 22a is connected between the gate 20g and the source 20s of the semiconductor switch 20.

Operation of Switch Device

Figure 8:
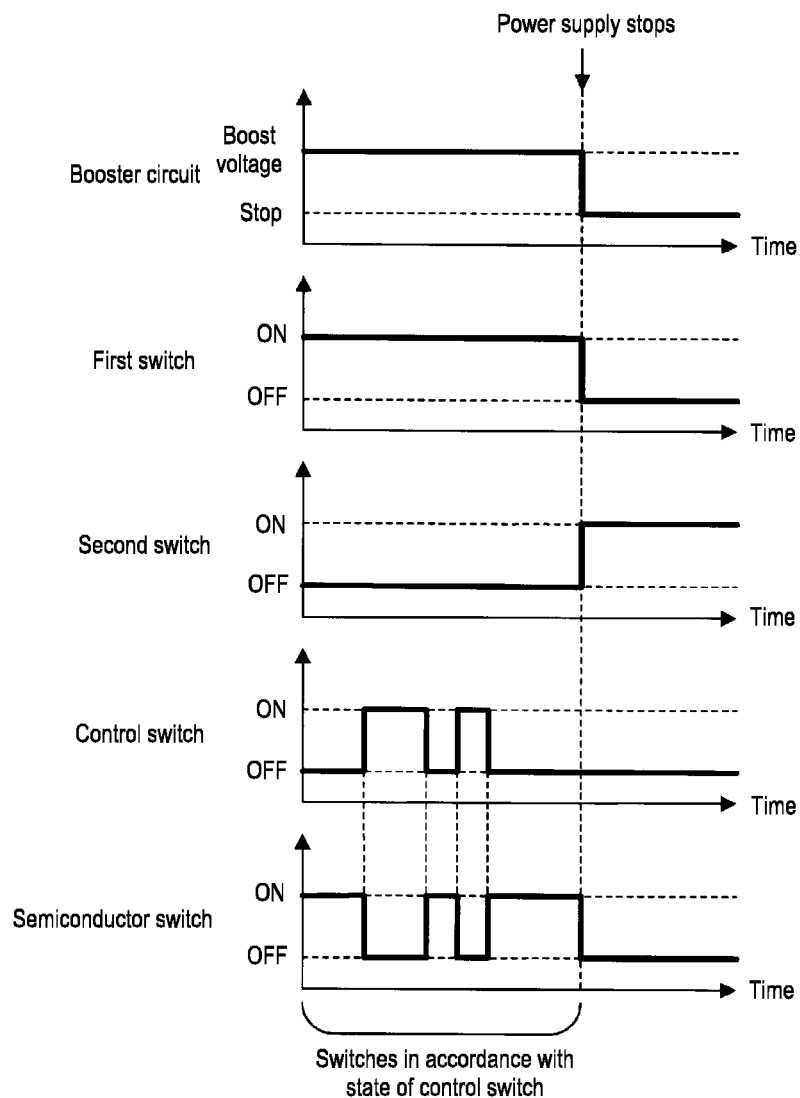
FIG. 8 is a timing chart for describing the operation of the switch device.

FIG. 8 is a timing chart for describing the operation of the switch device 11. In FIG. 8, the operation of the booster circuit 23, and the states of the first switch 21a, the second switch 22a, the control switch 24, and the semiconductor switch 20 are illustrated as in FIG. 2. The booster circuit 23, the control switch 24, and the semiconductor switch 20 function in a similar manner.

The first switching circuit 25a operates in a similar manner as the first switching circuit 25 in embodiment 1. Accordingly, the first switching circuit 25a keeps the first switch 21a on while the booster circuit 23 is performing voltage boosting. If the supply of power to the booster circuit 23 stops due to the connection terminals T1 and T2 being disconnected from one another or a disconnection occurring in the connection line K1, the first switching circuit 25a switches the first switch 21a from on to off.

The second switching circuit 26a keeps the second switch 22a off while the booster circuit 23 is performing voltage boosting, irrespective of the state of the semiconductor switch 20. If the supply of power to the booster circuit 23 stops due to the connection terminals T1 and T2 being disconnected from one another or a disconnection occurring in the connection line K1, the second switching circuit 26a switches the second switch 22a from off to on. When the second switch 22a switches on in a case in which the semiconductor switch 20 is on, the voltage of the gate 20g based on the potential of the source 20s decreases to 0 V in the semiconductor switch 20, and the semiconductor switch 20 switches off.

In such a manner, if the connection terminals T1 and T2 are disconnected from one another or a disconnection occurs in the connection line K1, an abnormality concerning the supply of power to the booster circuit 23 occurs, and the supply of power to the booster circuit 23 stops. Here, the second switch 22a switches on, and the semiconductor switch 20 switches off. Furthermore, if an abnormality in the supply of power to the booster circuit 23 occurs, no current flows from the drain 20d of the semiconductor switch 20 and via the booster circuit 23 and the second switch 22a because the first switch 21a switches off. Consequently, the amount of power consumed is suppressed.

Configuration of First Switching Circuit

Figure 9:
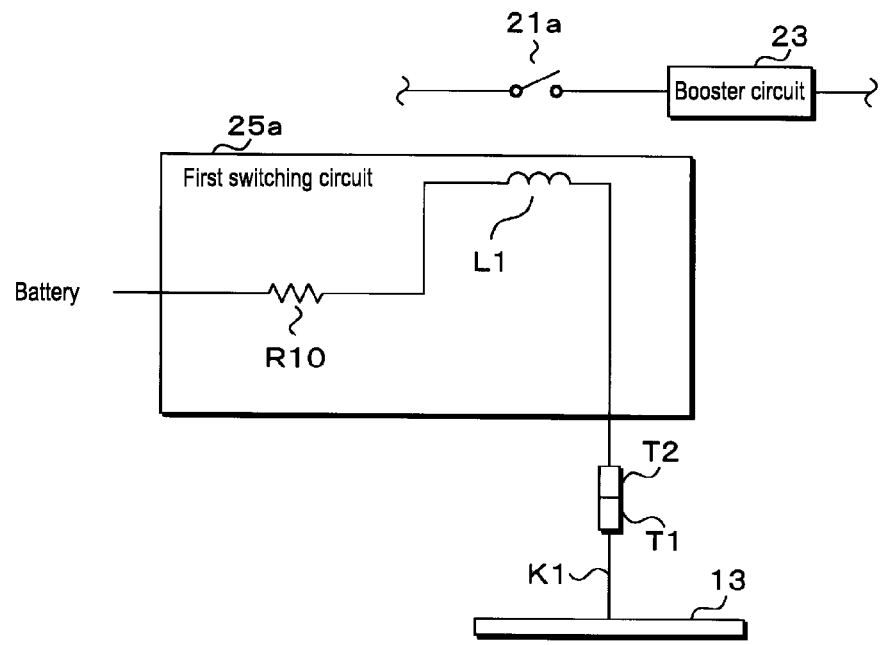
FIG. 9 is a circuit diagram of a first switching circuit.

FIG. 9 is a circuit diagram of the first switching circuit 25a. The first switching circuit 25a includes a resistor R10 and an inductor L1. One terminal of the resistor R10 is connected to the drain 20d of the semiconductor switch 20, i.e., the positive electrode of the battery 10. The other terminal of the resistor R10 is connected to one terminal of the inductor L1. The other terminal of the inductor L1 is connected to the connection terminal T2.

In the first switch 21a, an end portion of a bar-shaped first conductor is pivotably connected to one terminal. If the first conductor is in contact with the other terminal, the first switch 21a is on. If the first conductor is separated from the other terminal, the first switch 21a is off. In the first switch 21a, the first conductor is pulled away from the other terminal by a spring, for example.

If the connection terminals T1 and T2 are connected to one another and the connection terminal T1 is connected to the GND conductor 13 via the connection line K1, a current flows from the positive electrode of the battery 10, through the resistor R10, the inductor L1, the connection terminals T2 and T1, and the GND conductor 13 in this order, and back to the negative electrode of the battery 10. While a current is flowing through the inductor L1, the inductor L1 functions as a magnet and attracts the first conductor of the first switch 21a to the other terminal side of the first switch 21a so that the first conductor is brought into contact with the other terminal in the first switch 21a. Thus, if the connection terminals T1 and T2 are connected to one another and the connection terminal T1 is connected to the GND conductor 13 via the connection line K1, the first switch 21a is on.

If the supply of power to the booster circuit 23 stops due to the connection terminals T1 and T2 being disconnected from one another or a disconnection occurring in the connection line K1, the current flow via the inductor L1 stops. Thus, the inductor L1 stops functioning as a magnet. Consequently, the first conductor separates from the other terminal in the first switch 21a, and the first switch 21a switches off.

Configuration of Second Switching Circuit

Figure 10:
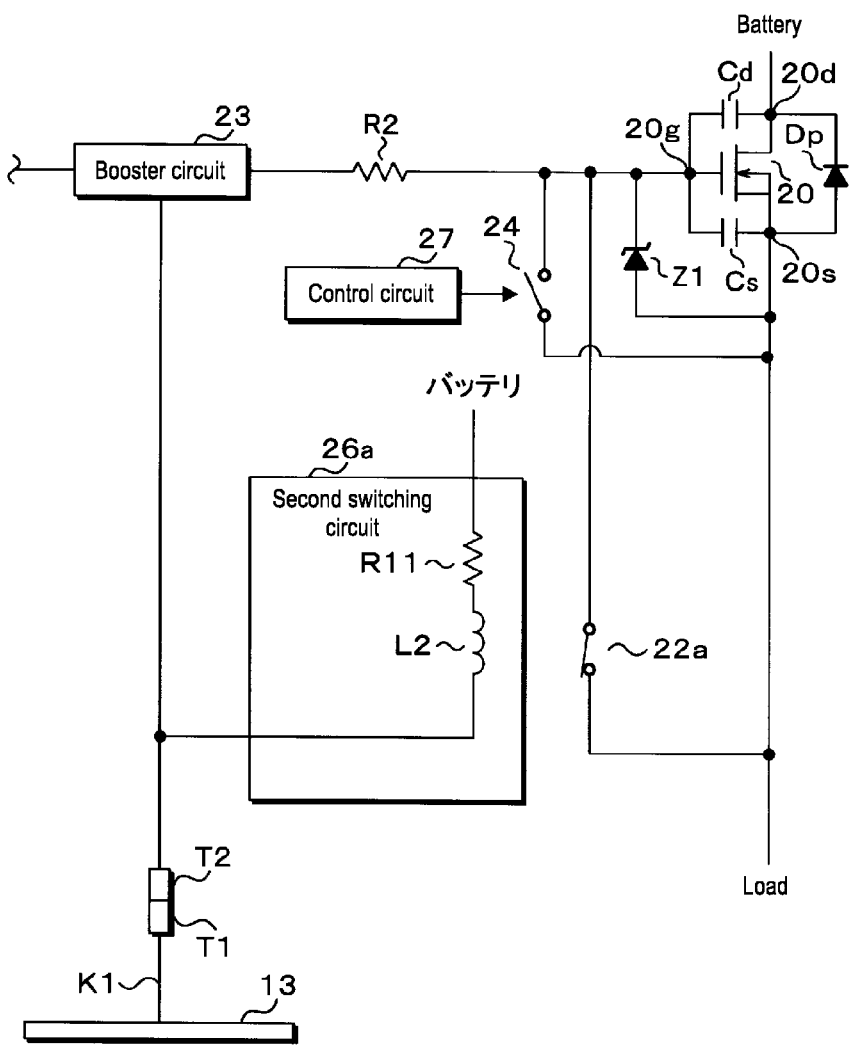
FIG. 10 is a circuit diagram of a second switching circuit.

FIG. 10 is a circuit diagram of the second switching circuit 26a. The second switching circuit 26a includes a resistor R11 and an inductor L2. One terminal of the resistor R11 is connected to the drain 20d of the semiconductor switch 20, i.e., the positive electrode of the battery 10. The other terminal of the resistor R11 is connected to one terminal of the inductor L2. The other terminal of the inductor L2 is connected to the connection terminal T2.

In the second switch 22a, an end portion of a bar-shaped second conductor is pivotably connected to one terminal. If the second conductor is in contact with the other terminal, the second switch 22a is on. If the second conductor is separated from the other terminal, the second switch 22a is off. In the second switch 22a, the second conductor is pulled by a spring, for example, so as to be kept in contact with the other terminal.

If the connection terminals T1 and T2 are connected to one another and the connection terminal T1 is connected to the GND conductor 13 via the connection line K1, a current flows from the positive electrode of the battery 10, through the resistor R11, the inductor L2, the connection terminals T2 and T1, and the GND conductor 13 in this order, and back to the negative electrode of the battery 10. While a current is flowing through the inductor L2, the inductor L2 functions as a magnet and attracts the second conductor of the second switch 22a in a direction away from the other terminal of the second switch 22a so that the second conductor is separated from the other terminal in the second switch 22a. Thus, if the connection terminals T1 and T2 are connected to one another and the connection terminal T1 is connected to the GND conductor 13 via the connection line K1, the second switch 22a is off.

If the supply of power to the booster circuit 23 stops due to the connection terminals T1 and T2 being disconnected from one another or a disconnection occurring in the connection line K1, the current flow via the inductor L2 stops. Thus, the inductor L2 stops functioning as a magnet. Consequently, the second conductor comes into contact with the other terminal once again in the second switch 22a, and the second switch 22a switches on.

In such a manner, the second switch 22a switches off if a current flows through the resistor R11 and the inductor L2 and power is consumed in the second switching circuit 26a. If the current flow via the resistor R11 and the inductor L2 stops and the power consumption stops, the second switch 22a switches on. Thus, the second switch 22a switches on independently of the battery voltage, the resistance value of the booster circuit 23, etc. Consequently, if an abnormality concerning the supply of power to the booster circuit 23 occurs, the second switch 22a reliably switches on, and the semiconductor switch 20 reliably switches off.

Note that, in the switch device 11 in embodiment 1, the first switch 21a and the first switching circuit 25a in embodiment 2 may be used in place of the first switch 21 and the first switching circuit 25. Similarly, in the switch device 11 in embodiment 1, the second switch 22a and the second switching circuit 26a in embodiment 2 may be used in place of the second switch 22 and the second switching circuit 26.

In embodiments 1 and 2, it suffices for the semiconductor switch 20 to be a switch in which the resistance value between a current input terminal to which a current is input and a current output terminal from which a current is output decreases as the voltage of a control terminal based on the potential of the current output terminal increases. Thus, the semiconductor switch 20 is not limited to an N-channel FET, and may be an insulated-gate bipolar transistor (IGBT), an NPN bipolar transistor, or the like.

Embodiments 1 and 2 disclosed herein are examples in every way, and shall be construed as being non-limiting. The scope of the present invention is not limited to what is defined above, and is intended to include all modifications that are indicated by the claims and are within the meaning and scope of equivalents of the claims.

The invention claimed is:

1. A switch device comprising:
   a semiconductor switch in which a resistance value between a current input terminal to which a current is input and a current output terminal from which a current is output decreases as a voltage of a control terminal based on a potential of the current output terminal increases;
   a booster circuit that is disposed on a path extending from the current input terminal to the control terminal, and that boosts a voltage input from a side of the current input terminal and applies the boosted voltage to the control terminal;
   a first switch that is connected between the current input terminal and the booster circuit and that switches off if the supply of power to the booster circuit stops; and
   a second switch that is switched off by receiving a power supply and that switches on when the power supply stops,
   wherein the second switch is connected between the control terminal and the current output terminal, and
   the power supply stops when the supply of power to the booster circuit stops.

2. The switch device according to claim 1, wherein, a resistance value of the second switch between a control terminal of the second switch and a current output terminal of the second switch increases as a voltage of the control terminal of the semiconductor switch, based on a potential of the current output terminal of the semiconductor switch, decreases,
   the switch device further comprises a resistor that is connected between the current input terminal and the control terminal of the second switch,
   a current flows from the current input terminal to the control terminal of the second switch via the resistor while the semiconductor switch is on, and
   the current flow via the resistor stops if the supply of power to the booster circuit stops.

3. The switch device according to claim 2 further including a Zener diode which is connected between the control terminal and the current input terminal of the semiconductor switch, a cathode and an anode of the Zener diode being respectively connected to the control terminal and the current input terminal of the semiconductor switch,
wherein the booster circuit boosts the voltage input from the current input terminal to a target voltage, and
a breakdown voltage of the Zener diode is higher than the target voltage.

* * * * *